United States Patent
Kanai

(10) Patent No.: US 6,654,282 B2
(45) Date of Patent: Nov. 25, 2003

(54) NONVOLATILE SEMICONDUCTOR MEMORY DEVICE

(75) Inventor: Masahiro Kanai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/197,646

(22) Filed: Jul. 18, 2002

(65) Prior Publication Data

US 2003/0048674 A1 Mar. 13, 2003

(30) Foreign Application Priority Data

Jul. 23, 2001 (JP) ........................................ 2001-221788

(51) Int. Cl.[7] .............................................. G11C 16/04
(52) U.S. Cl. ............................ 365/185.05; 365/185.11; 365/185.13; 365/63
(58) Field of Search ....................... 365/185.05, 185.11, 365/185.12, 185.13, 185.18, 63

(56) References Cited

U.S. PATENT DOCUMENTS

| | | |
|---|---|---|
| 5,111,428 A | 5/1992 | Liang et al. |
| 5,126,808 A | 6/1992 | Montalvo et al. |
| 5,268,861 A | 12/1993 | Hotta |
| 5,315,541 A | 5/1994 | Harari et al. |
| 5,345,416 A | 9/1994 | Nakagawara |
| 5,408,115 A | 4/1995 | Chang |
| 5,422,504 A | 6/1995 | Chang et al. |
| 5,494,838 A | 2/1996 | Chang et al. |
| 5,969,383 A | 10/1999 | Chang et al. |
| 6,177,318 B1 | 1/2001 | Ogura et al. |
| 6,248,633 B1 | 6/2001 | Ogura et al. |
| 6,255,166 B1 | 7/2001 | Ogura et al. |
| 6,563,728 B2 * | 5/2003 | Kobayashi ................... 365/63 |

FOREIGN PATENT DOCUMENTS

| | | |
|---|---|---|
| JP | A 63-193400 | 8/1988 |
| JP | A 63-268194 | 11/1988 |
| JP | A 63-268195 | 11/1988 |
| JP | A 64-5072 | 1/1989 |
| JP | A 7-161851 | 6/1995 |
| JP | B1 2978477 | 9/1999 |
| JP | A 2001-156188 | 6/2001 |
| JP | 2002359306 A * | 12/2002 ....... H01L/21/8247 |

OTHER PUBLICATIONS

Document No. 10/153,686, dated May 24, 2002, Owa.
Document No. 10/153,736, dated May 24, 2002, Owa.
Document No. 10/157,896, dated May 31, 2002, Kamei et al.
Document No. 10/157,897, May 31, 2002, Kamei et al.
Document No. 10/115,956, Apr. 5, 2002, Kamei.
Hayashi et al., "Twin MONOS Cell with Dual Control Gates", 2000 Symposium on VLSI Technology Digest of Technical Papers.

(List continued on next page.)

Primary Examiner—Son Mai
(74) Attorney, Agent, or Firm—Oliff & Berridge, PLC

(57) ABSTRACT

A nonvolatile semiconductor memory device has a memory cell array region in which a plurality of memory cells, each having first and second MONOS memory cells, is arranged. A plurality of bit lines extend in the first direction, each of the bit lines being connected with each of the plurality of memory cells. The first control gate and the second control gate are formed on one side and the other side of each of the plurality of bit lines, the first control gate being connected with one of two of the memory cells adjacent each other in the second direction and second control gate being connected with the other of the two memory cells. The first and second control gates are respectively formed on either sides of each of the plurality of bit lines. Ends of the first and second control gates are respectively connected by two continuous sections. Each of the bit lines has a projecting section on one end portion. The projecting section has a large-width region having a width greater than a width of each of the bit lines in a region in which the plurality of memory cells are formed.

5 Claims, 17 Drawing Sheets

OTHER PUBLICATIONS

Chang et al., "A New SONOS Memory Using Source–Side Injection for Programming", IEEE Electron Device Letters, vol. 19, No. 7, 1998.

Chen et al., "A Novel Flash Memory Device with S Plit Gate Source Side Injection and ONO Charge Storage Stack (SPIN)", 1997 Symposium on VLSI Technology Digest Technical Papers.

Document No. 10/115,913, dated Apr. 5, 2002, Kamei.
Document No. 10/153,611, dated May 24, 2002, Owa.
Document No. 09/955,160, dated Sep. 19, 2001, Kanai et al.
Document No. 09/955,158, dated Sep. 19, 2001, Kanai et al.
Document No. 10/197,668, dated Jul. 18, 2002, Kanai.
Document No. 10/197,643, dated Jul. 18, 2002, Kanai et al.
Document No. 10/197,644, dated Jul. 18, 2002, Kanei.
Document No. 10/187,645, dated Jul. 18, 2002, Natori.

* cited by examiner

FIG. 7A
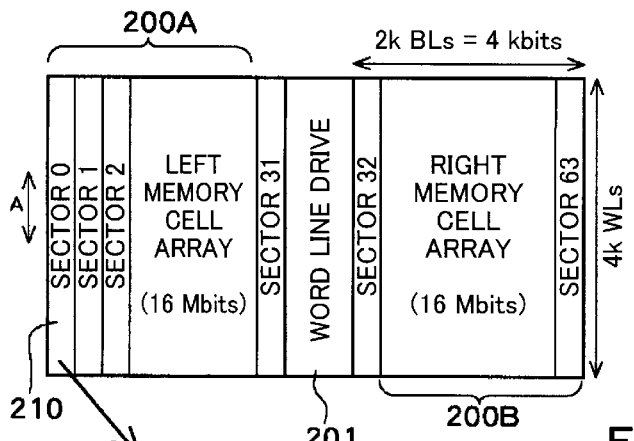
FIG. 7B  FIG. 7C  FIG. 7D
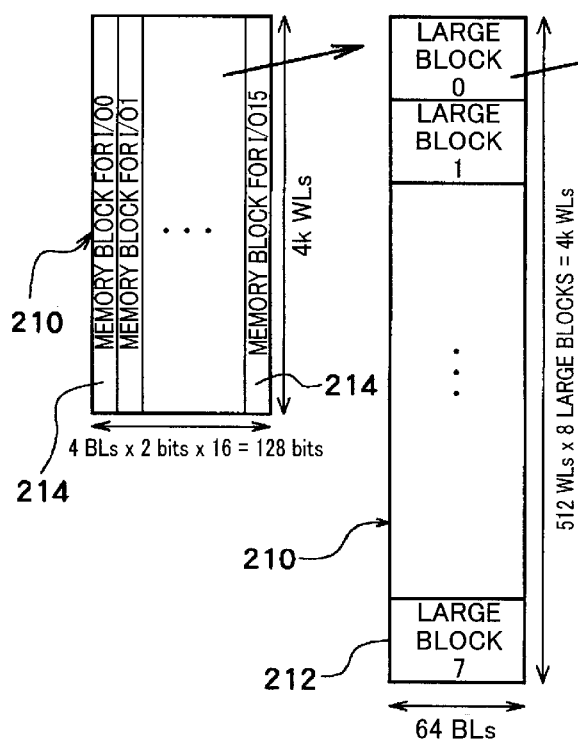
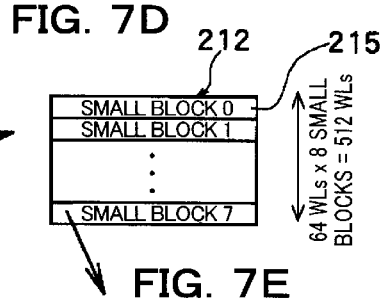
FIG. 7E
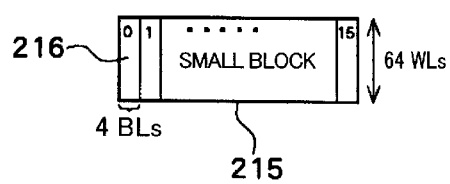

NONVOLATILE SEMICONDUCTOR MEMORY DEVICE

Japanese Patent Application No. 2001-221788 filed on Jul. 23, 2001, is hereby incorporated by reference in its entirety.

BACKGROUND OF THE INVENTION

The present invention relates to a nonvolatile semiconductor memory device including memory cells, each having two nonvolatile memory elements controlled by one word gate and two control gates.

As one type of nonvolatile semiconductor memory device, a MONOS (Metal-Oxide-Nitride-Oxide-Semiconductor or -Substrate) device is known. In the MONOS nonvolatile semiconductor memory device, a gate-insulating layer between a channel and a gate is formed of a laminate consisting of a silicon oxide film, silicon nitride film, and silicon oxide film. Charges are trapped in the silicon nitride film.

The MONOS nonvolatile semiconductor memory device is disclosed in the literature (Y. Hayashi, et al., 2000 Symposium on VLSI Technology Digest of Technical Papers, pp. 122 to 123). This literature discloses a MONOS flash memory cell including two nonvolatile memory elements (MONOS memory cells) controlled by one word gate and two control gates. Specifically, one flash memory cell has two charge trap sites. A memory cell array region is formed by arranging a plurality of MONOS flash memory cells having such a structure in the row direction and the column direction.

BRIEF SUMMARY OF THE INVENTION

The present invention may provide a nonvolatile semiconductor memory device enabling contact sections for connecting bit lines to be easily formed and capable of decreasing the resistance of the control gates.

One aspect of the present invention relates to a nonvolatile semiconductor memory device comprising a memory cell array region in which a plurality of memory cells are arranged in a first direction and a second direction intersecting each other, each of the memory cells having first and second nonvolatile memory elements and being controlled by one word gate and first and second control gates.

A plurality of bit lines extending in the first direction, each of the bit lines being connected with the memory cells arranged in the first direction are provided.

The first control gate and the second control gate adjacent each other in the second direction are respectively formed on one side and the other side of each of the plurality of bit lines. Ends of the first and second control gates formed on the one side and the other side of each of the plurality of bit lines are respectively connected by two continuous sections. This enables to reduce the resistance of the control gates by approximately fifty percent in comparison with the case where only one end of each of the first and second control gates is connected with each other by one continuous section.

Each of the plurality of bit lines has a projecting section in which one end portion thereof projects in the first direction outside an end of an adjacent bit line among the bit lines arranged in the second direction. The projecting section has a large-width region having a width greater than a width of each of the bit lines in a region in which the plurality of memory cells are formed. Therefore, contact sections for drawing the bit lines are easily formed in the projecting sections.

In the one aspect of the present invention, end portions of even-numbered bit lines among the plurality of bit lines, on one side, may project in the first direction outside ends of odd-numbered bit lines among the plurality of bit lines, on the one side; and end portions of the odd-numbered bit lines, on an opposite side to the one side, may project in the first direction outside ends of the even-numbered bit lines, on the opposite side. This enables the degree of integration of the memory cells to be increased as described later.

In the one aspect of the present invention, the memory cell array region may comprise a plurality of block regions formed by dividing the memory cell array region in the first direction, each of the block regions having the memory cells. Each of the plurality of block regions may be provided with a plurality of sub bit lines extending in the first direction and may be connected with the memory cells, respectively; and a plurality of main bit lines may be formed extending across the plurality of block regions in the first direction, each of the main bit lines being connected in common with the plurality of sub bit lines which are respectively formed in the plurality of block regions arranged in the first direction.

The first control gate and the second control gate may be formed on one side and the other side of each of the plurality of sub bit lines, respectively. Ends of the first and second control gates formed on the one side and the other side of each of the plurality of sub bit lines may respectively be connected by two continuous sections.

Each of the plurality of sub bit lines may have a projecting section in which one of the end portions projects in the first direction outside an end of an adjacent sub bit line among the sub bit lines arranged in the second direction. The projecting section may have a large-width region having a width greater than a width of each of the sub bit lines in a region in which the plurality of memory cells are formed.

In one aspect of the present invention, end portions of even-numbered sub bit lines among the plurality of sub bit lines, on one side, may project in the first direction outside ends of odd-numbered sub bit lines among the plurality of sub bit lines, on the one side; and end portions of the odd-numbered sub bit lines, on an opposite side to the one side, may project in the first direction outside ends of the even-numbered sub bit lines, on the opposite side. This enables the degree of integration of the memory cells to be increased for reasons described later.

In the one aspect of the present invention, the plurality of sub bit lines disposed in two of the block regions adjacent in the first direction may include first sub bit lines which are disposed in one of the two block regions and second sub bit lines which are disposed in the other of the two block regions, one of the first sub bit lines and one of the second sub bit lines being connected with the same one of main bit lines and respectively having projecting sections facing each other.

BRIEF DESCRIPTION OF THE SEVERAL VIEWS OF THE DRAWING

FIG. 7A is a plan layout view showing the entire nonvolatile semiconductor memory device shown in FIG. 1; FIG. 7B is a plan view of one sector region shown in FIG. 7A; FIG. 7C is a plan view of the sector region; FIG. 7D is a plan view of one large block shown in FIG. 7C; and FIG. 7E is a plan view of one small block shown in FIG. 7D;

DETAILED DESCRIPTION OF THE EMBODIMENT

An embodiment of the present invention is described below with reference to the drawings.

Structure of Memory Cell

Figure 1:
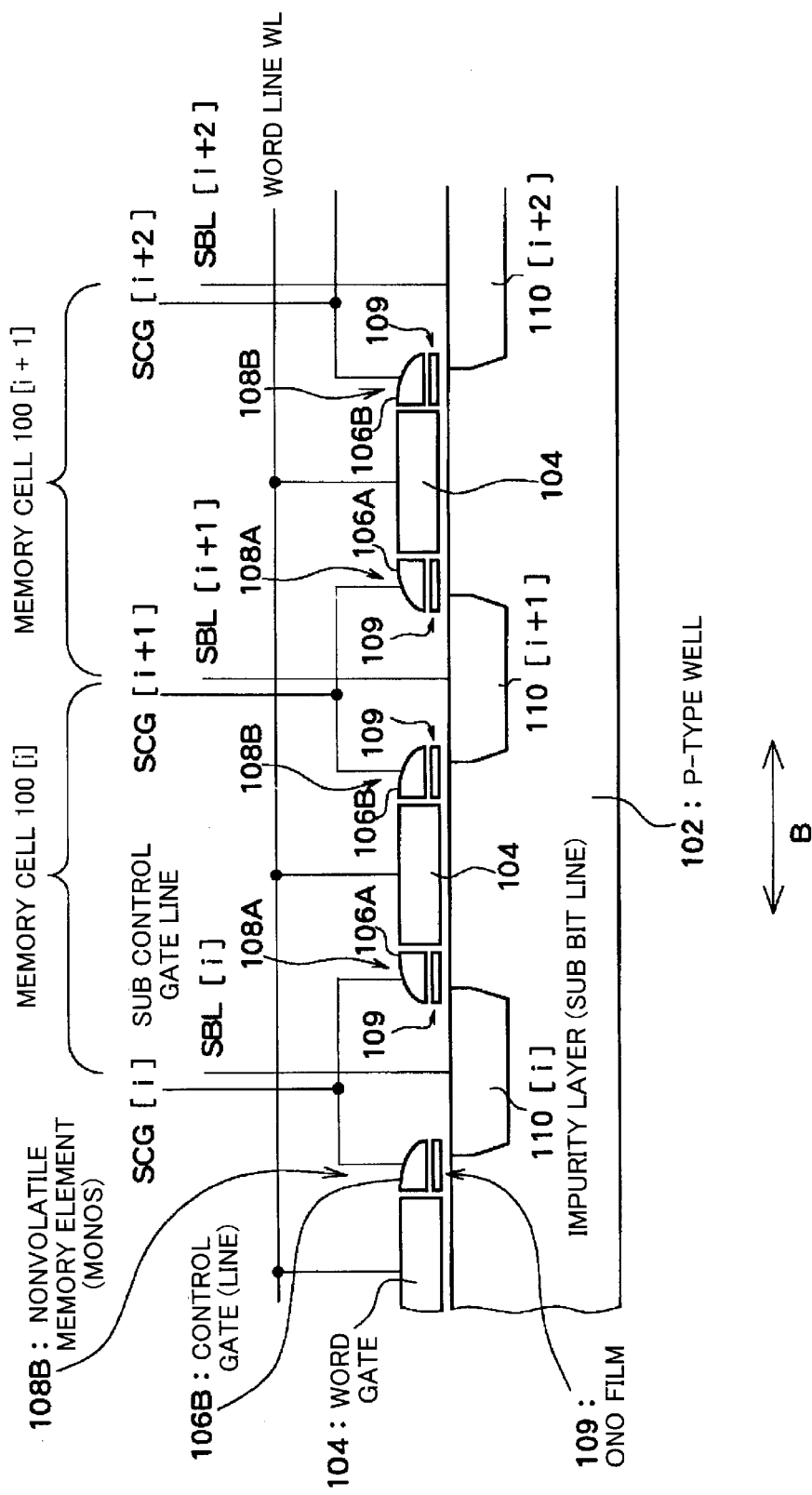
FIG. 1 is a cross-sectional view showing memory cells used in a nonvolatile semiconductor memory device according to one embodiment of the present invention.
Figure 2:
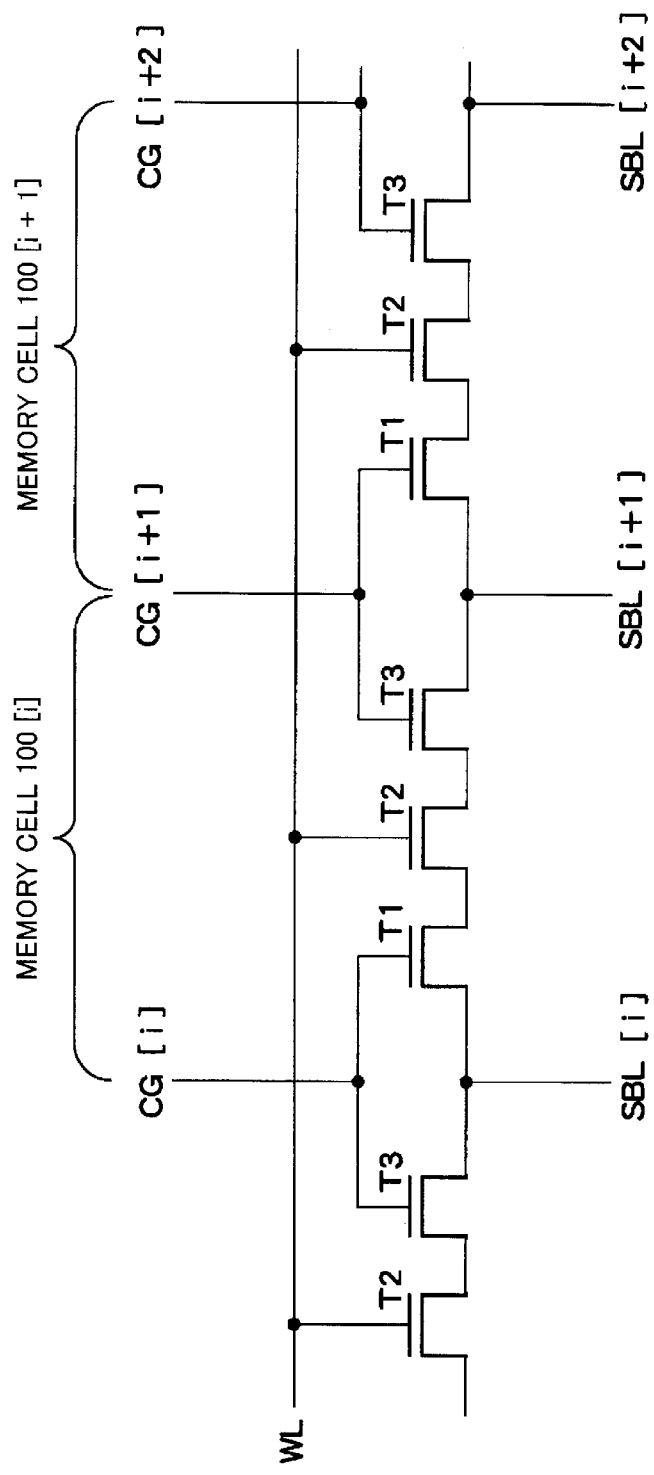
FIG. 2 is an equivalent circuit diagram of the memory cells shown in FIG. 1.

FIG. 1 is a view showing a cross section of a nonvolatile semiconductor memory device. FIG. 2 is an equivalent circuit diagram of the nonvolatile semiconductor memory device. In FIG. 1, one memory cell 100 includes a word gate 104 formed of a polycide or the like on a P-type well 102 through a gate insulating film, first and second control gates 106A and 106B, and first and second memory elements (MONOS memory cells) 108A and 108B.

The first and second control gates 106A and 106B are formed on opposite sidewalls of the word gate 104. The first and second control gates 106A and 106B are electrically insulated from the word gate 104.

Each of the first and second memory elements 108A and 108B is formed by layering an oxide film (O), nitride film (N), and oxide film (O) between either the first control gate 106A or the second control gate 106B formed of polysilicon corresponding to M (Metal) in the MONOS and the P-type well 102 corresponding to S. The first and second control gates 106A and 106B may be formed using a conductive material such as a silicide.

As described above, one memory cell 100 includes the first and second MONOS memory cells 108A and 108B, each having a split gate (first and second control gates 106A and 106B). One word gate 104 is shared by the first and second MONOS memory cells 108A and 108B.

The first and second MONOS memory cells 108A and 108B function as charge trap sites. Each of the first and second MONOS memory cells 108A and 108B can trap charges in the ONO film 109.

As shown in FIGS. 1 and 2, a plurality of word gates 104 arranged at intervals in the row direction (second direction B in FIGS. 1 and 2) is connected in common with one word line WL formed of a polycide or the like.

The control gates 106A and 106B shown in FIG. 1 extend along the column direction (first direction A perpendicular to the surface of FIG. 1) and are shared by a plurality of memory cells 100 arranged in the column direction. Therefore, the control gates 106A and 106B maybe referred to as sub control gate lines.

A sub control gate line SCG [i+1] formed of a first metal layer in an upper layer of the word gate, control gate, and word line is connected with the control gate 106B in the [i]th memory cell 100 [i] and the control gate 106A in the [i+1]st memory cell 100 [i+1 ].

An [i+1]st impurity layer 110 [i+1] shared by the MONOS memory cell 108B in the [i]th memory cell 100 [i] and the MONOS memory cell 108A in the [i+1]st memory cell 100 [i+1] is formed in the P-type well 102.

The impurity layers 110 [i], 110 [i+1], and 110 [i+2] are n-type impurity layers formed in the P-type well, for example. The impurity layers 110 [i], 110 [i+1], and 110 [i+2] function as sub bit lines which extend along the column direction (first direction A perpendicular to the surface of FIG. 1) and are shared by a plurality of memory cells 100 arranged in the column direction. Therefore, the impurity layers 110 [i], 110 [i+1], 110 [i+2] may be referred to as sub bit lines SBL [i], SBL [i+1], and SBL [i+2].

Reading of Data from Memory Cell

As shown in FIG. 2, a transistor T2 driven by the word gate 104 and transistors T1 and T3 respectively driven by the first and second control gates 106A and 106B are connected in series in one memory cell 100.

Figure 3:
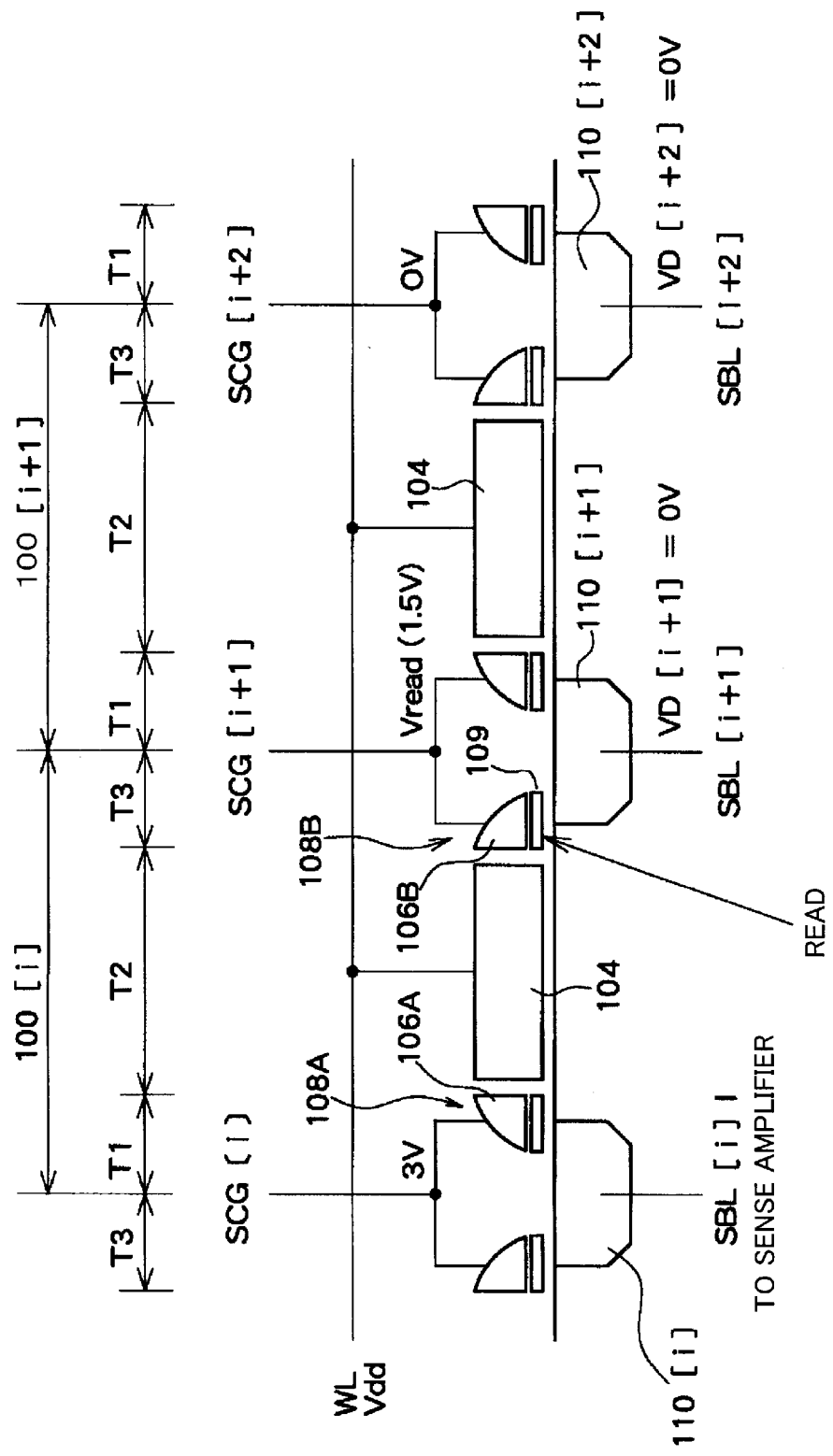
FIG. 3 is a schematic explanatory diagram for describing a data read operation of the nonvolatile semiconductor memory device shown in FIG. 1.

Setting of the potential at each point of two adjacent memory cells 100 [i] and 100 [i+1] is described below with reference to FIG. 3. FIG. 3 is a view for describing reading of data from the MONOS memory cell 108B on the right of the word gate 104 in the memory cell 100 [i].

In this case, each of the transistors T2 is turned ON by applying a voltage Vdd (1.8 V, for example) to each of the word gates 104 in the same row as the memory cell 100 [i]. The transistor T1 corresponding to the MONOS memory cell 108A is turned ON by applying an override voltage (3 V, for example) to the control gate 106A on the left side of the memory cell 100 [i] through the sub control gate line SCG [i]. A read voltage Vread (1.5 V, for example) is applied as a potential VCG of the control gate 106B on the right side of the memory cell 100 [i].

The operation of the transistor T3 corresponding to the MONOS memory cell 108B differs as described below depending upon whether or not charges are stored in the MONOS memory cell 108B on the right of the word gate 104.

Figure 4:
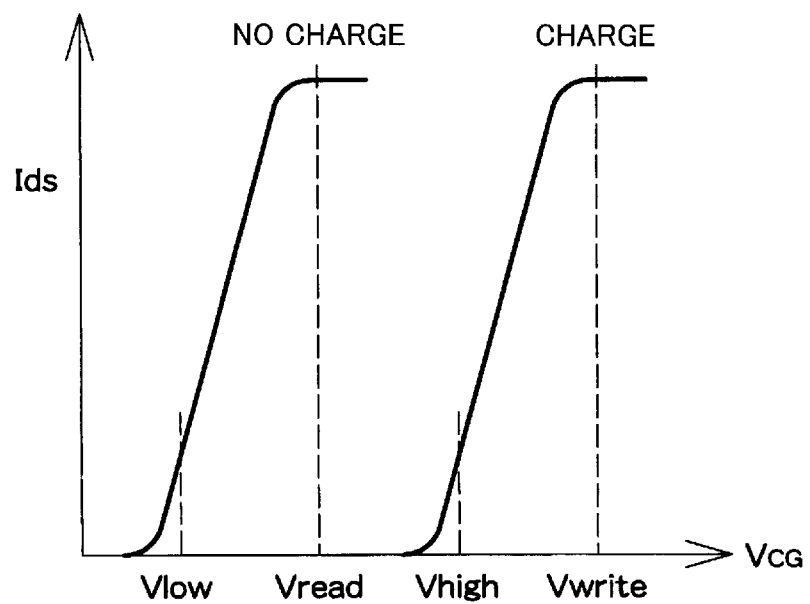
FIG. 4 is a characteristic diagram showing a relation between a control gate voltage VCG and a source-drain current Ids in the memory cells shown in FIG. 1.

FIG. 4 shows the relation between a voltage applied to the control gate 106B on the right side of the memory cell 100 [i] and a current Ids which flows between source/drain of the transistor T3 corresponding to the MONOS memory cell 108B controlled by this voltage.

As shown in FIG. 4, in the case where charges are not stored in the MONOS memory cell 108B, the current Ids starts to flow when the control gate potential VCG exceeds a lower threshold voltage Vlow. In the case where charges are stored in the MONOS memory cell 108B, the current Ids does not start to flow unless the control gate potential VCG exceeds a higher threshold voltage Vhigh.

The voltage Vread applied to the control gate 106B at the time of reading data is set to approximately an intermediate voltage between the two threshold voltages Vlow and Vhigh.

Therefore, the current Ids flows if charges are not stored in the MONOS memory cell 108B, and the current Ids does not flow if charges are stored in the MONOS memory cell 108B.

At the time of reading data, a potential VD [i] of the sub bit line SBL [i] (impurity layer 110 [i]) is set to the sense amplifier and the potential VD [i+1] of the sub bit line SBL [i+1] (impurity layer 110 [i+1]) is set to 0 V. This allows the current Ids to flow when charges are not stored in the MONOS memory element 108B (selected side), whereby a current of 25 µA or more flows through the sub bit line SBL [i] on the opposite side through the transistors T1 and T2 in an ON state, for example. Since the current Ids does not flow when charges are stored in the MONOS memory element 108B (selected side), current flowing through the sub bit line SBL [i] on the opposite side is less than 108A even if the transistors T1 and T2 are in an ON state, for example. Therefore, data can be read from the MONOS memory element 108B (selected side) in the memory cell 100 [i] by detecting the current flowing through the sub bit line SBL [i] on the opposite side using the sense amplifier.

The transistors T1 and T2 are turned ON in the memory cell 100 [i+1]. However, since the control gate potential VCG of the transistor T3 is set to 0 V, which is lower than the threshold voltages Vlow and Vhigh shown in FIG. 3, the source-drain current does not flow in the memory cell 100 [i+1]. Therefore, data storage conditions in the memory cell 100 [i+1] do not adversely affect the reading of data from the memory cell 100 [i].

In the case of reading data from the MONOS memory cell 108A on the left side of the memory cell 100 [i], the potential at each point of the memory cell 100 [i−1] and [i] may be set in the same manner as described above.

Programming of Memory Cell

Figure 5:
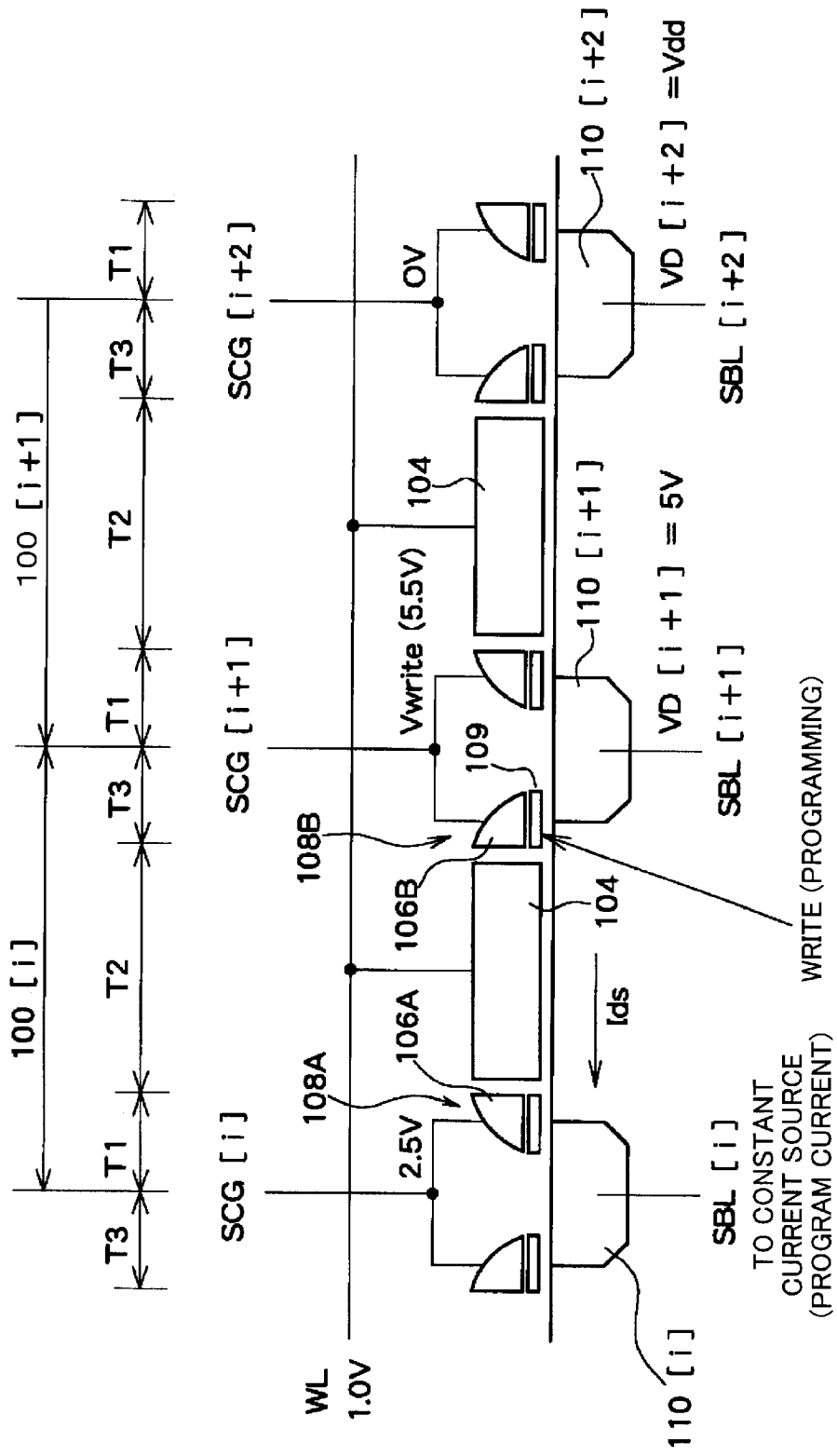
FIG. 5 is a schematic explanatory diagram for describing a data write (program) operation of the nonvolatile semiconductor memory device shown in FIG. 1.

FIG. 5 is a view for describing data programming of the MONOS memory cell 108B on the right of the word gate 104 in the memory cell 100 [i]. A data erase operation described later has been performed before this data program operation.

In FIG. 5, the potential of the sub control gate line SCG [i] is set to the override potential (2.5 V, for example) and the potential of the sub control gate line SCG [i+2] is set to 0 V in the same manner as shown in FIG. 3. The potential of each word gate 104 is set to a programming word line select voltage which is lower than the power supply voltage Vdd (about 1.0 V, for example) by the word line WL. The potential of the control gate 106B on the right side of the memory cell 100 [i+1] is set to a write potential Vwrite (5.5 V, for example) shown in FIG. 4 through the sub control gate line SCG [i+1]. The potential VD [i+1] of the [i+1]st impurity layer 110 [i+1] (sub bit line SBL [i+1]) is set to 5 V, for example. The potential VD [i] of the [i]th impurity layer 110 [i] (sub bit line SBL [i]) is set to a voltage when a program current of 5 µA is caused to flow (0 to 1 V), for example.

This causes the transistors T1 and T2 in the memory cell 100 [i] to be turned ON, whereby the current Ids flows toward the impurity layer 110 [i]. At the same time, channel hot electrons (CHE) are trapped in the ONO film 109 of the MONOS memory cell 108B. The program operation of the MONOS memory cell 108B is performed in this manner, whereby data "0" or "1" is written in.

Erasing of Data in Memory Cell

Figure 6:
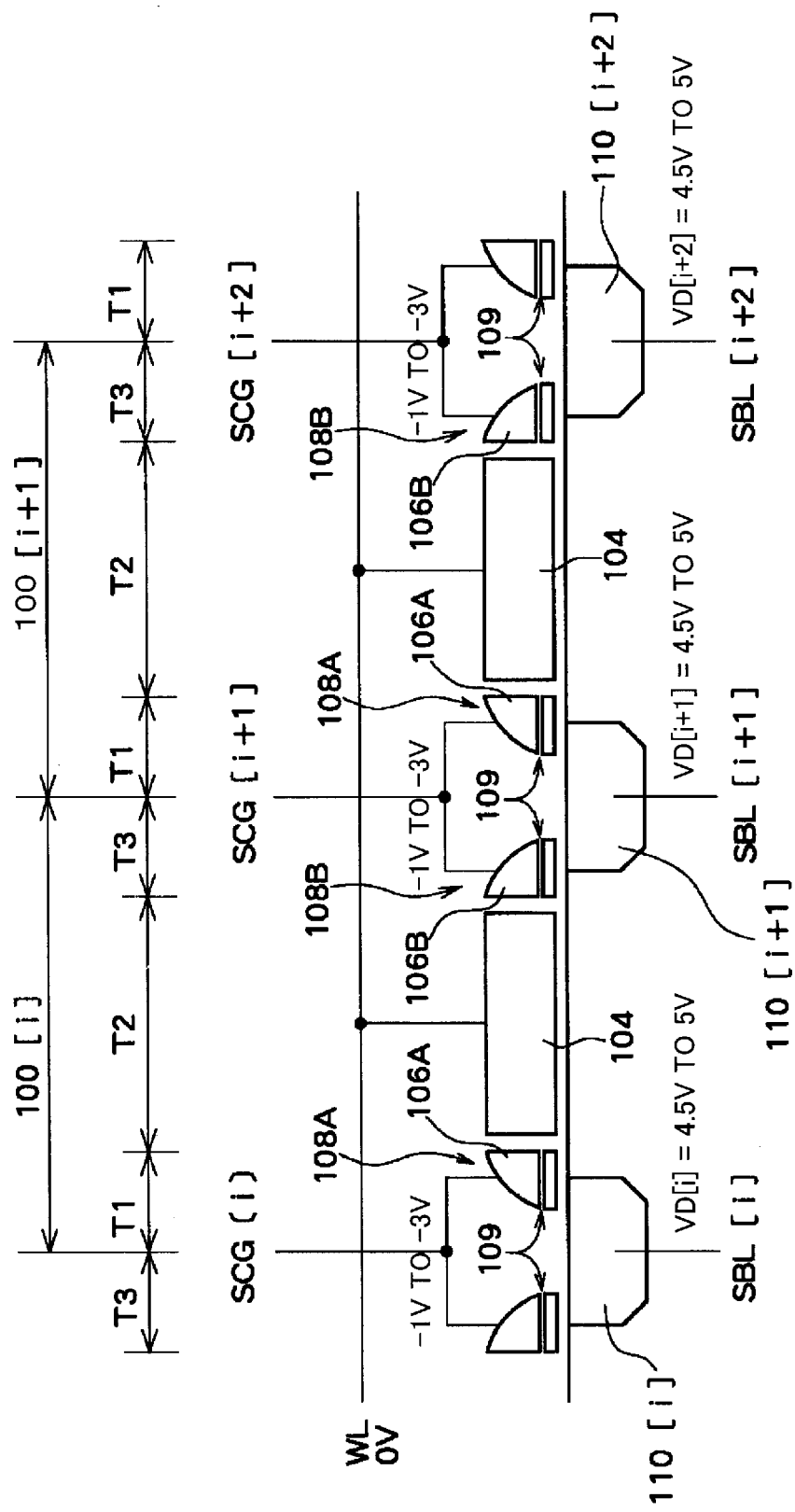
FIG. 6 is a schematic explanatory diagram for describing a data erase operation of the nonvolatile semiconductor memory device shown in FIG. 1.

FIG. 6 is a view for describing data erase of the memory cells 100 [i] and [i+1] connected with the word line WL.

In FIG. 6, the potential of each word gate 104 is set to 0 V by the word line WL, for example. The potential of the control gates 106A and 106B is set to about −1 to −3 V (first high potential for erasing) by the sub control gate lines SCG [i], [i+1], and [i+2], for example. The potential of the impurity layers (sub bit lines) 110 [i], [i+1], and [i+2] is set to 4.5 to 5 V (second high potential for erasing) equal to the potential of the P-type well.

This causes electrons trapped in the ONO films 109 of the MONOS memory cells 108A and 108B to be extracted and erased by a tunnel effect caused by an electric field formed by the first high potential for erasing being applied to the metal (M) and the second high potential for erasing being applied to the silicon (S). This enables data to be erased in a plurality of memory cells at the same time. Differing from the above example, the stored electrons may be erased by forming hot holes using band—band tunneling on the surface of the impurity layers which become the sub bit lines.

Entire Configuration of Nonvolatile Semiconductor Memory Device

The entire configuration of the nonvolatile semiconductor memory device formed by using the above-described memory cells 100 is described below with reference to FIGS. 7A to 7E.

FIG. 7A is a plan view showing a layout of one chip of nonvolatile semiconductor memory device. Memory cell array regions 200A and 200B are respectively formed on two sides of a word line driver section 201. Each of the memory cell array regions 200A and 200B is divided into 32 sector regions 210, for example. One chip of nonvolatile semiconductor memory device has the 0th to 63rd sector regions 210.

As shown in FIG. 7A, each of the memory cell array regions 200A and 200B next to each other is divided into 32 sector regions 210 in the second direction (row direction) B. Each of the sector regions 210 has a rectangular shape in which the first direction (column direction) A is the longitudinal direction. The sector region 210 is a minimum unit for data erasing. Data stored in the sector region 210 is collectively erased.

Each of the memory array regions 200A and 200B has 4K word lines WL and 2K sub bit lines SBL, for example. In the present embodiment, since two MONOS memory cells 108A and 108B are connected with one sub bit line SBL, 2K sub bit lines SBL mean a storage capacity of 4 Kbits. Since the nonvolatile semiconductor memory device shown in FIG. 7A has the memory array regions 200A and 200B next to each other, the nonvolatile semiconductor memory device has a storage capacity defined by (4K word lines WL)×(2K sub bit lines SBL)×2×2 as the entire memory. The storage capacity of each sector region 210 is 1/64 of the storage capacity of the entire memory. Each sector region 210 has a storage capacity defined by (4K word lines WL)×(64 sub bit lines SBL)×2.

FIG. 7B is a view showing the details of one sector region 210 of the nonvolatile semiconductor memory device shown in FIG. 7A. As shown in FIG. 7B, each sector region 210 is divided in the second direction and has memory blocks for I/O0 to I/O15 (memory blocks corresponding to input/output bits) 214 so that 16-bit data can be read from or written in the memory blocks.

As shown in FIG. 7B, each memory block 214 has 4 k (4096) word lines WL. As shown in FIG. 7C, the sector region 210 is divided into eight large blocks 212 in the first direction A. Each of the large blocks 212 is divided into eight small blocks 215 in the first direction A, as shown in FIG. 7D.

As shown in FIG. 7E, each small block 215 has 64 word lines WL. Each small block 215 formed of 16 small memory blocks 216 arranged along the row direction.

Therefore, the total number of word lines WL arranged in one large block 212 (including the word lines for redundancy) is 64×8 (small block)=512. Therefore, the total number of word lines WL arranged in one sector region 210 is 512×8 (large block)=4096.

Details of Sector Region

Figure 8:
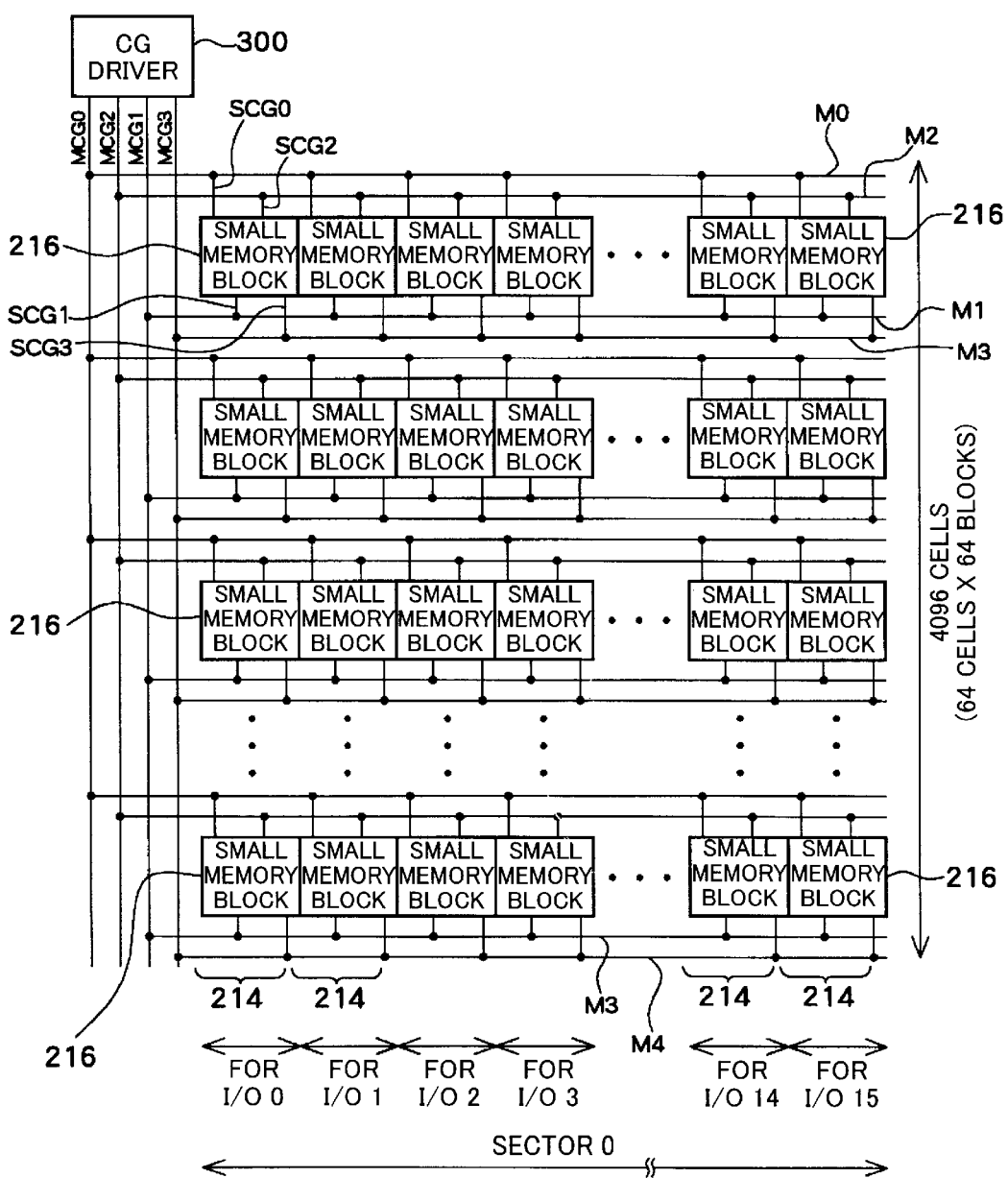
FIG. 8 is a schematic explanatory diagram for describing memory cells in one sector region shown in FIG. 7B and interconnects for the memory cells.

FIG. 8 is a view showing the details of the sector region 0 shown in FIG. 7A and a CG driver.

As shown in FIG. 8, 64 small memory blocks 216 are arranged in the column direction in one sector region 0. 16 small memory blocks 216 are arranged in the row direction corresponding to the I/O0 to I/O15 for performing 16-bit input/output.

16 sub control gate lines SCG0 of 16 small memory blocks 216 arranged in the row direction are connected in common with a second metal interconnect layer M0 extending in the row direction, for example. 16 sub control gate lines SCG1, 16 sub control gate lines SCG2, and 16 sub control gate lines SCG3 are respectively connected in common with a metal interconnect M1, metal interconnect M2, and metal interconnect M3.

A CG driver 300 is provided as a control gate driver section of the sector region 0. Four main control gate lines MCG0 to MCG3 are formed to extend from the CG driver 300 in the column direction. The main control gate lines MCG0 to MCG3 are formed of a third metal interconnect layer, for example.

Figure 9:
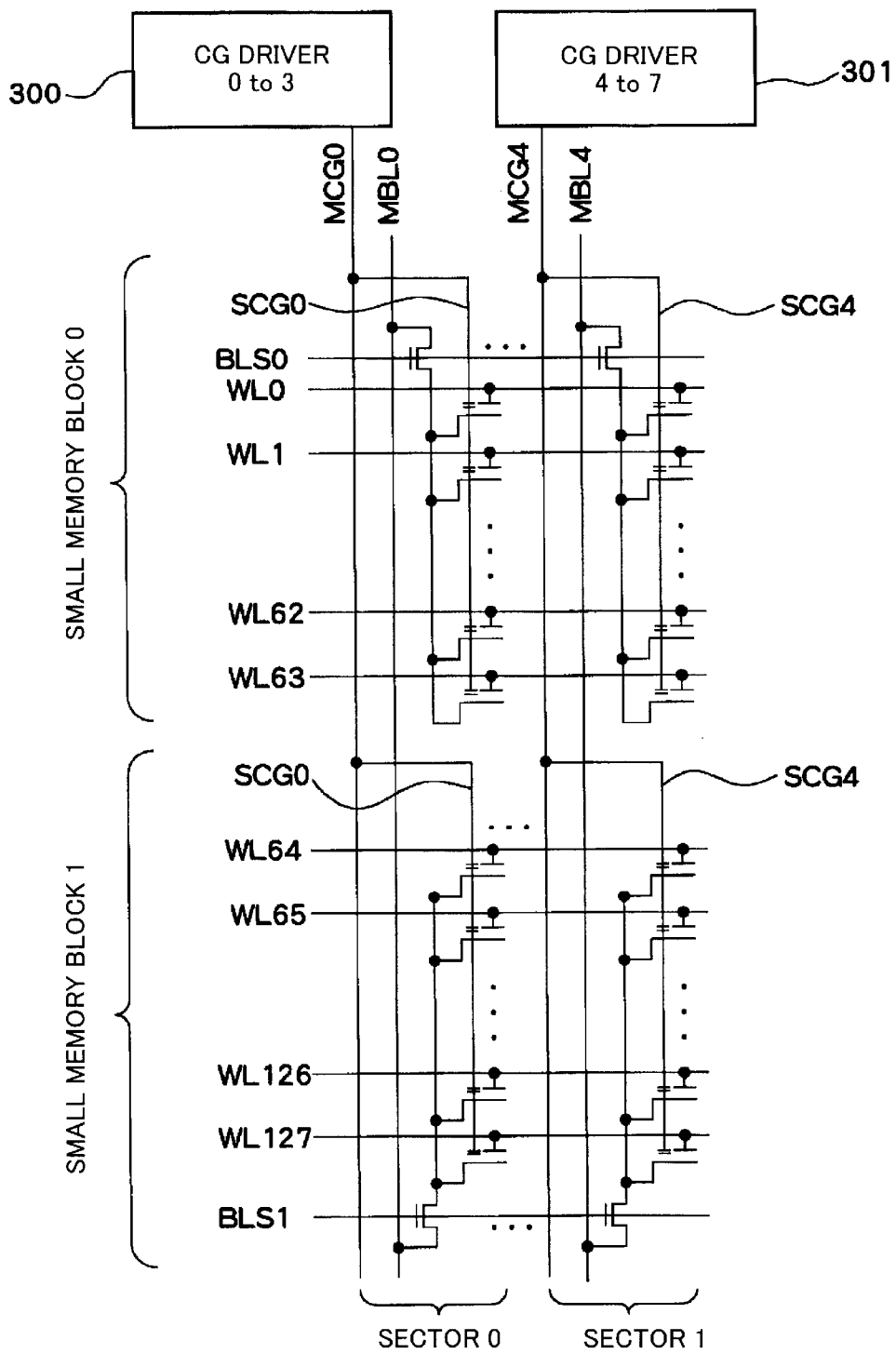
FIG. 9 is a circuit diagram showing the relation between the adjacent sector regions.

FIG. 9 is a view showing the relation between the sector region 0 and the sector region 1 adjacent thereto. The word lines WL are shared by the sector region 0 and the sector region 1. However, the main control gate lines MCG and the main bit lines MBL are separately provided in the sector region 0 and the sector region 1. The CG driver 300 corresponding to the sector region 0 and a CG driver 301 corresponding to the sector region 1 are illustrated in FIG. 9. The CG drivers are separately formed for each sector region.

Taking the sector 0 as an example, a plurality of sub control gate lines SCG0 disposed for each small memory block 216 is connected in common with the main control gate line MCG0. A gate circuit is not disposed in the route from the main control gate line MCG0 to the sub control gate line SCG0. This also applies to sector regions other than the sector region 0.

Configuration of Small Memory Block

Figure 10:
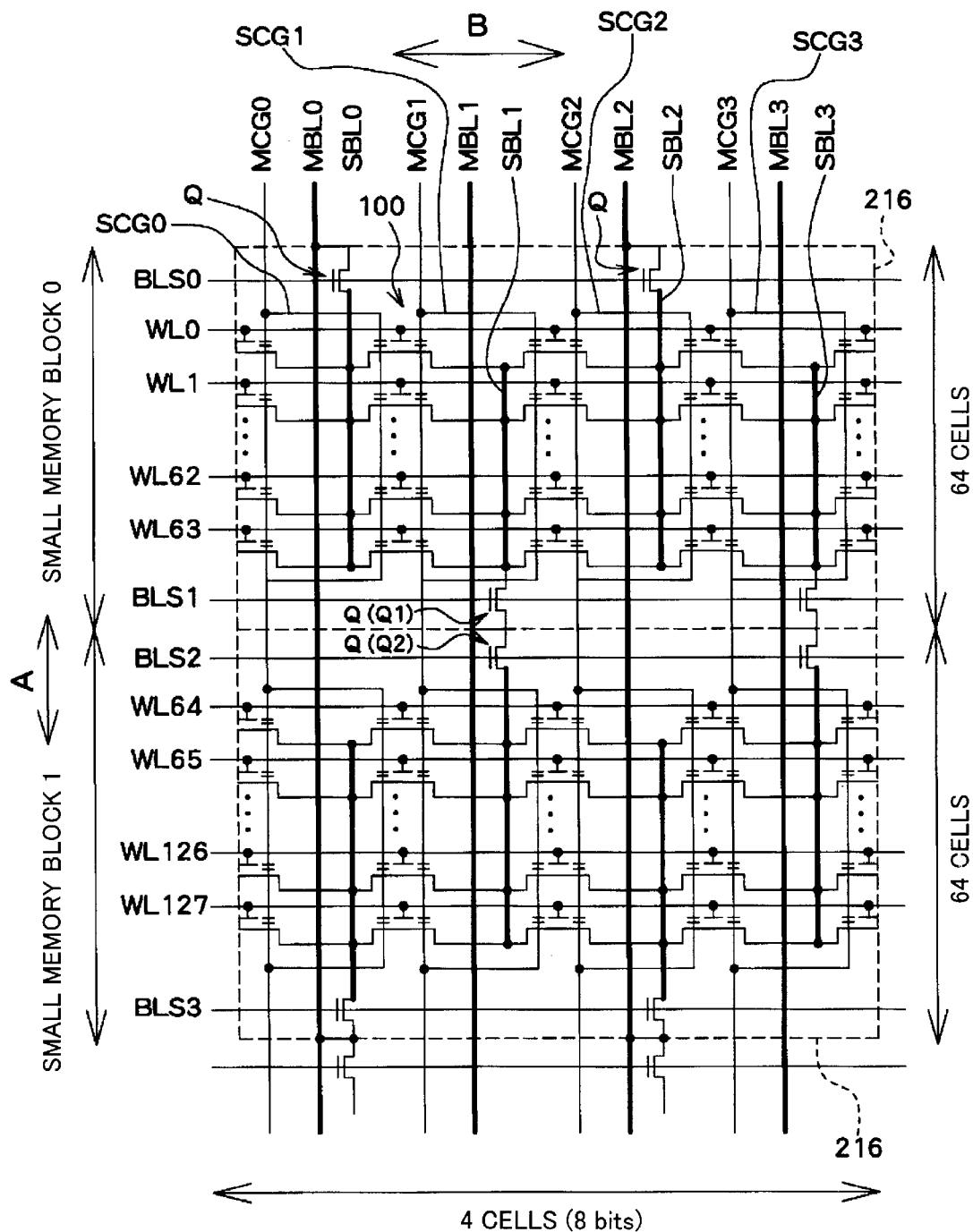
FIG. 10 is a schematic diagram for describing the memory cells in the memory cell array region and the interconnects for the memory cells.
Figure 11:
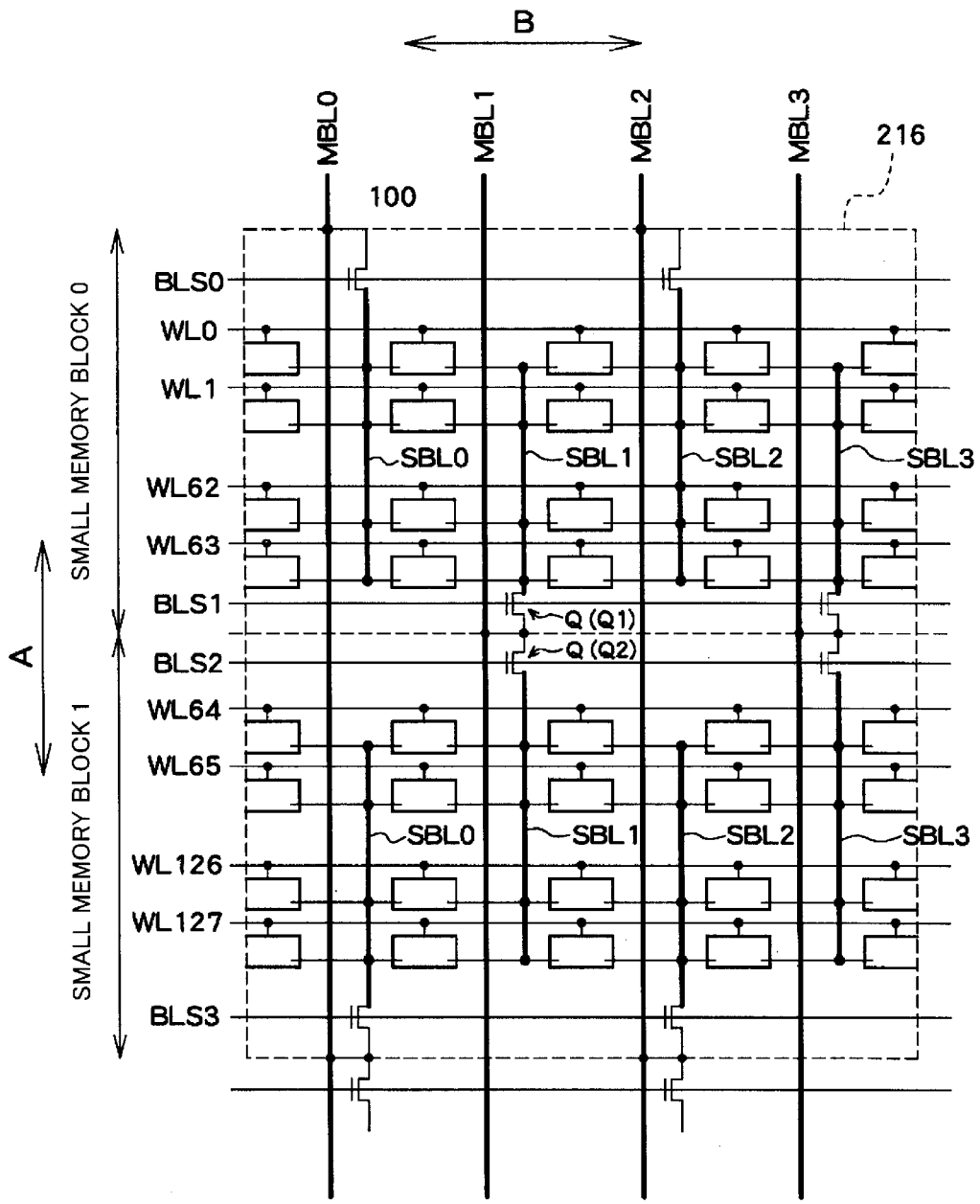
FIG. 11 is a wiring diagram showing the relation between sub bit lines and main bit lines in the memory cell array region shown in FIG. 10.

The small memory block 216 is described below in detail. FIG. 10 is a schematic circuit diagram for describing the memory cells in the memory cell array region including the small memory blocks and interconnects for the memory cells. FIG. 11 is a circuit wiring diagram clearly showing the relation between the sub bit lines and the main bit lines in the memory cell array region shown in FIG. 10.

In the small memory block 216, 64 memory cells 100 are arranged in the column direction and four memory cells 100 are arranged in the row direction, for example. Four sub control gate lines SCG0 to SCG3 formed of polysilicon in the shape of a sidewall, for example, four sub bit lines SBL0 to SBL3 which are data input/output lines, and 64 word lines WL are connected to one small memory block 216.

The second control gates 106B of a plurality of memory cells in the even-numbered rows (zeroth row or second row) and the first control gates 106A of a plurality of memory cells in the odd-numbered rows (first row or third row) are connected in common with the even-numbered sub control gate lines SCG0 and SCG2. The second control gates 106B of a plurality of memory cells in the odd-numbered rows (first row or third row) and the first control gates 106A of a plurality of memory cells in the even-numbered rows (second row or fourth row) are connected in common with the odd-numbered sub control gate lines SCG1 and SCG3.

Each of the sub bit lines SBL0 to SBL3 extends along the first direction (column direction) A and is connected in common with a plurality of memory cells formed on two sides thereof.

The sub bit lines SBL0 to SSB3 are connected with the main bit lines MBL0 to MBL3, respectively.

As shown in FIGS. 10 and 11, select switching elements Q which select connection/disconnection between the sub bit lines SBL and the main bit lines MBL are formed at connection points between the sub bit lines SBL and the main bit lines MBL. The select switching elements Q are formed on the end portion of the sub bit lines SBL. The select switching elements Q are turned ON/OFF based on the potential of select signal lines BLS. When the select switching element Q is turned ON, the sub bit line SBL and the main bit line MBL are in a conducting state in the selected small memory block 216. The sub bit line SBL in the non-selected small memory block 216 is in a floating state.

Each of the select switching elements Q is connected with one of the ends of the even-numbered sub bit lines SBL0 and SBL2 and to the opposite ends of the odd-numbered sub bit lines SBL1 and SBL3. Specifically, the select switching elements Q of the even-numbered sub bit lines SBL0 and SBL2 and the select switching elements Q of the odd-numbered sub bit lines SBL1 and SBL3 are formed on opposite ends.

One of the select switching elements Q disposed in two small memory blocks 216 adjacent in the first direction A is referred to as a first select transistor Q1, and the other is referred to as a second select transistor Q2. The first and second select transistors Q1 and Q2 adjacent in the first direction A, connected with the same main bit line MBL, are formed next to each other.

The features of this section are described below.

1. The sub bit line SBL is connected with the main bit line MBL through the select switching element Q. Therefore, the selected sub bit line SBL and the main bit line MBL can be in a conducting state, and the non-selected sub bit line SBL and the above main bit line MBL can be in a nonconducting state. As a result, interconnect capacitance of the sub bit line SBL at the time of reading/writing can be decreased, whereby the memory cells can be accessed at a higher speed at the time of reading/writing.

2. The select switching elements Q are formed on end portions of the even-numbered sub bit lines SBL0 and SBL2, on one side, or end portions of the odd-numbered sub bit lines SBL1 and SBL3, one the opposite side to the one side. This enables the following actions and effects to be obtained.

2.1. The distance between one of the select switching elements Q and the memory cells 100 and the distance between the other select switching element Q and the memory cells 100 are equal between each memory cell 100. Therefore, the sum of the resistance of the sub bit lines SBL equals between each memory cell 100. As a result, the potential difference applied between the source-drain is fixed between each memory cell 100, whereby unevenness of the characteristics can be reduced.

2.2. Since the select switching elements Q of the odd-numbered sub bit lines SBL can be disposed in the space between the even-numbered sub bit lines SBL, the channel width of the select switching elements Q of the odd-numbered sub bit lines SBL can be increased. Similarly, the channel width of the select switching elements Q of the even-numbered sub bit lanes SBL can be increased.

2.3. The first and second select transistors Q1 and Q2 adjacent in the first direction A, connected with the same main bit line MBL, are formed next to each other. This enables the impurity layer of the select transistors to be shared. As a result, the degree of integration of the memory can be increased.

Planar Layout of Small Memory Block

Figure 12:
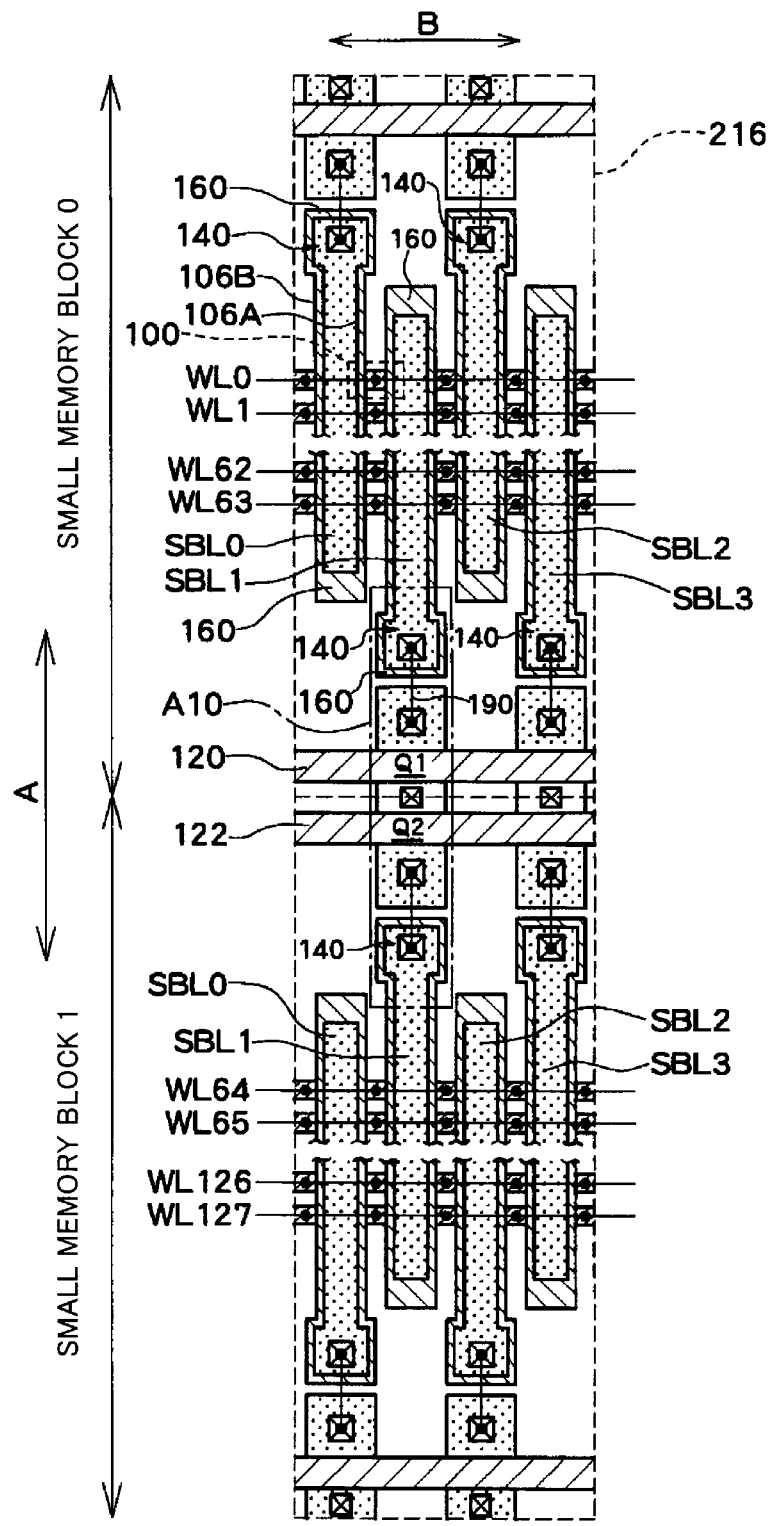
FIG. 12 is a plan view showing a planar layout of the memory cell array region shown in FIGS. 10 and 11.

FIG. 12 is a plan view showing a layout of the nonvolatile semiconductor memory device in bulk shown in FIGS. 10 and 11. In FIG. 12, the word lines WL and local interconnect layers 190 are schematically indicated by lines.

Each of the sub bit lines SBL0 to SBL3 is formed of sub bit impurity layers formed in the semiconductor substrate. Each of the sub bit lines SBL has a projecting section 140 which projects in the first direction A outside the end of the adjacent sub bit line SBL. The projecting section 140 has a large-width region having a width greater than the width of the sub bit line SBL in a region in which the memory cells 100 are formed.

In the even-numbered sub bit lines SBL0 and SBL2, each of the projecting sections 140 is formed at an end portion of the sub bit lines, on one side. In the odd-numbered sub bit lines SBL1 and SBL3, each of the projecting sections 140 is formed at an end portion of the sub bit lines, on the opposite side to the one side. The projecting sections 140 of two sub bit lines SBL adjacent in the first direction A are formed to face each other.

The first control gate 106A and the second control gate 106B are respectively formed on two sides of each of the sub bit lines SBL0 to SBL3. Ends of each of the first and second control gates 106A and 106B on the two sides of the sub bit line SBL are respectively connected by two continuous sections 160.

Strap group regions A10 are formed between the sub bit lines SBL adjacent in the first direction (column direction) A (for example, between the sub bit line SBL1 in the small memory block 0 and the sub bit line SBL1 in the small memory block 1).

The first and second select transistors Q1 and Q2 are formed in each strap group region A10. The first select transistor Q1 is formed at a position facing the projecting section 140 on one side of the strap group region A10. The second select transistor Q2 is formed at a position facing the projecting section 140 on the other side of the strap group region A10.

The first select transistor Q1 selects connection/disconnection between the sub bit line SBL on one side of the strap group region A10 and the main bit line MBL. The second select transistor Q2 selects connection/disconnection between the sub bit line SBL on the other side of the strap group region A10 and the main bit line MBL. The select transistors Q1 and Q2 may be formed by field effect transistors (MOS transistors, for example).

Figure 13:
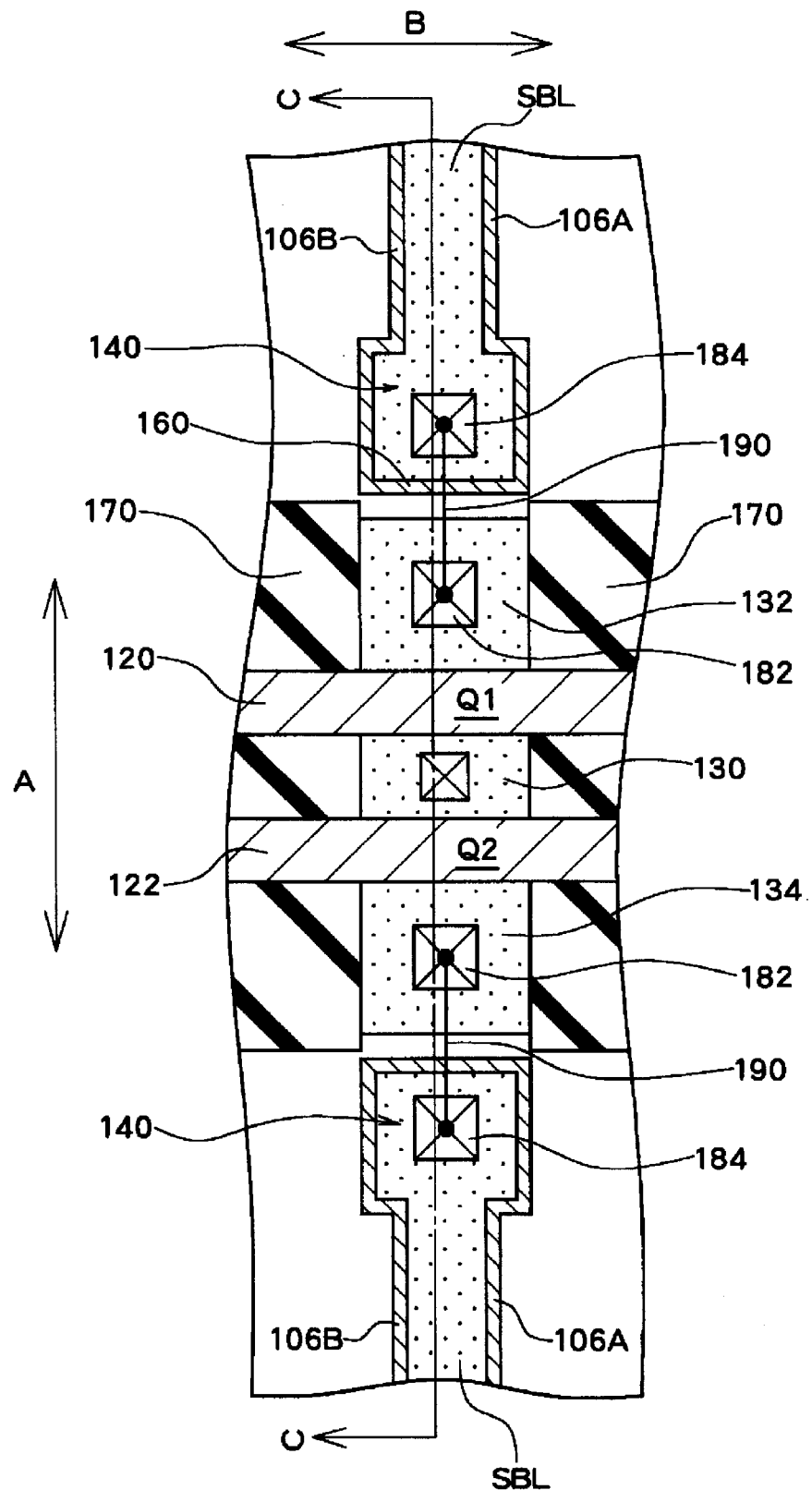
FIG. 13 is an enlarged plan view of a strap group region (region indicated by A10) shown in FIG. 12.
Figure 14:
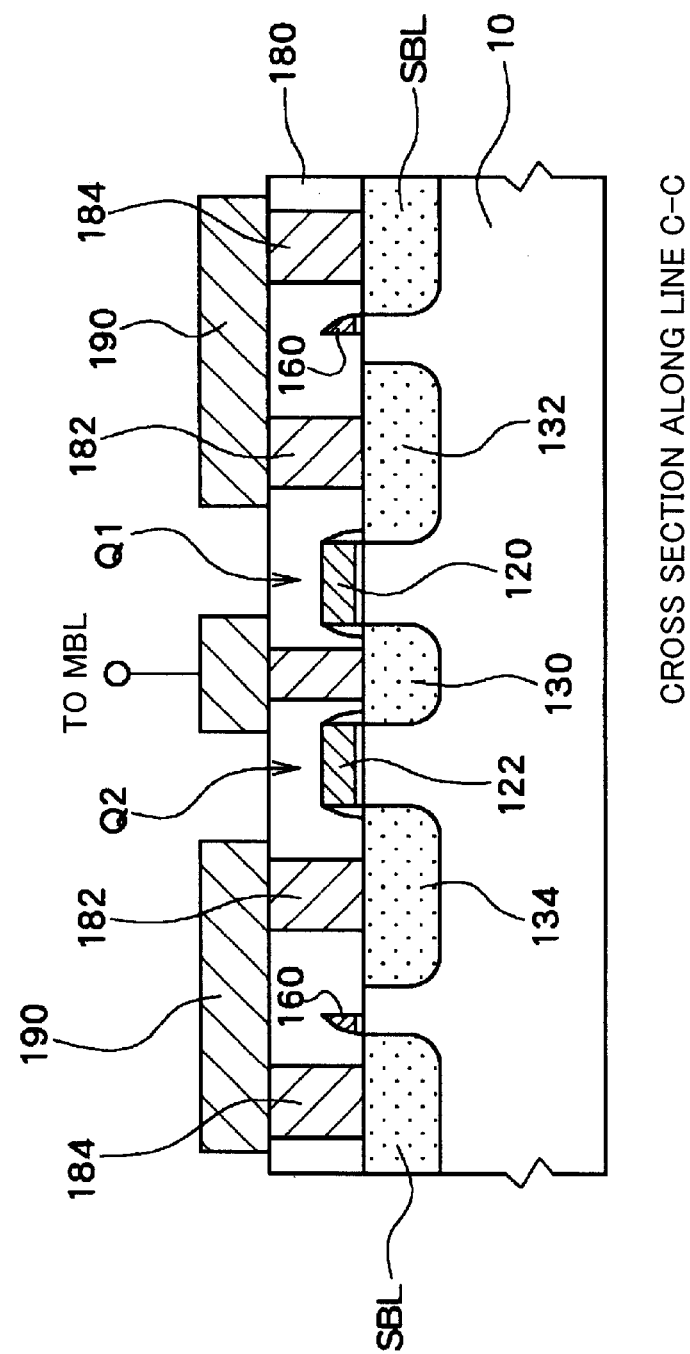
FIG. 14 is a cross-sectional view schematically showing the cross section along the line C—C shown in FIG. 13.

The strap group region A10 is described below in detail with reference to FIG. 13. FIG. 13 is an enlarged plan view of the strap group region A10 shown in FIG. 12. FIG. 14 is a cross-sectional view schematically showing the cross section along the line C—C shown in FIG. 13. In FIG. 13, the local interconnect layers 190 are schematically indicated by lines.

The strap group region A10 includes first and second gate electrodes 120 and 122 and first to third impurity layers 130, 132, and 134. If the sub bit lines SBL are formed of n-type impurity layers, conductivity type of the first to third impurity layers 130, 132, and 134 is n-type.

The regions of the select transistors Q1 and Q2 in the strap group region A10 are specified by element isolation regions 170.

The first and second gate electrodes 120 and 122 extend in the second direction B. The first impurity layer 130 is formed between the first and second gate electrodes 120 and 122. The first impurity layer 130 functions as a source or drain of the first and second select transistors Q1 and Q2. The first impurity layer 130 is shared by the first and second select transistors Q1 and Q2.

The second impurity layer 132 is formed between the first gate electrode 120 and one of the sub bit lines (sub bit impurity layer) SBL. The second impurity layer 132 functions as the source or drain of the first select transistor Q1. The third impurity layer 134 is formed between the second gate electrode 122 and the other sub bit line (sub bit impurity layer) SBL. The third impurity layer 134 functions as the source or drain of the second select transistor Q2.

As shown in FIGS. 13 and 14, the second impurity layer 132 and the sub bit line SBL are electrically connected through two contact sections 182 and 184 formed in an interlayer dielectric and the local interconnect layer 190.

The third impurity layer 134 and the sub bit line SBL (sub bit impurity layer) are electrically connected through two contact sections 182 and 184 formed in the interlayer dielectric and the local interconnect layer 190.

The features and actions and effects of this planar layout are described below.

1. Each of the projecting sections 140 has a large-width region having a width greater than the width of the sub bit line SBL in the region in which the memory cells 100 are formed. Therefore, the contact sections 184 for connecting the sub bit lines SBL are easily formed in the projecting sections 140.

2. Ends of the first and second control gates 106A and 106B are respectively connected by two continuous sections 160. This enables to reduce the resistance of the control gates by approximately fifty percent in comparison with the case where only one end of each of the first and second control gates 106A and 106B is connected with each other by one continuous section.

3. In the even-numbered sub bit lines SBL0 and SBL2, the projecting sections 140 are formed on the end portions of the sub bit line, on one side. In the odd-numbered sub bit lines SBL1 and SBL3, the projecting sections 140 are formed on the end portions of the sub bit lines, on the opposite side to the one side. This enables the following actions and effects to be obtained.

The select switching elements Q for connecting the sub bit lines SBL with the main bit lines MBL are formed at a position facing the projecting sections 140. In this case, the distance between one of the select switching elements Q and the memory cells 100 and the distance between the other select switching element Q and the memory cells 100 are equal between each memory cell 100. Therefore, the sum of the resistance of the sub bit lines SBL is equal between each memory cell 100. As a result, the potential difference applied between the source-drain is fixed between each memory cell 100, whereby unevenness of the characteristics can be reduced.

Moreover, since the select switching elements Q of the odd-numbered sub bit lines SBL can be disposed in the space between the even-numbered sub bit lines SBL, the channel width of the select switching elements Q of the odd-numbered sub bit lines SBL can be increased. Similarly, the channel width of the select switching elements Q of the even-numbered sub bit lines SBL can be increased.

Description of Operation

Tables 1 to 3 show the potential of the sub control gate line SCG, sub bit line SBL, and word line WL to be set at the time of erasing data and programming in the nonvolatile semiconductor memory device of the present embodiment.

TABLE 1

| | Selected cell | | | |
|---|---|---|---|---|
| | SCG | SBL | WL | BLS |
| Erase | −1 to −3 V | 4.5 to 5 V | 0 V | 8 V |
| Program | 5.5 V or 2.5 V | 5 V | 1 V | 8 V |

TABLE 2

| | Non-selected cell (in selected sector) | | | |
|---|---|---|---|---|
| | SCG | SBL | WL | BLS |
| Erase | — | — | — | — |
| Program | 5.5 V or 2.5 V or 0 V | 0 V | 0 V | 8 V |

TABLE 3

| | Non-selected cell (in non-selected sector) | | | |
|---|---|---|---|---|
| | SCG | SBL | WL | BLS |
| Erase | 0 V | 0 V | 0 V | 8 V |
| Program | 0 V | 0 V | 0 V or 1 V | 8 V |

In Table 1, since all the memory cells in the sector region 0 (selected sector) become the selected cells at the time of erasing data, 0 V is supplied to 4096 word lines WL, for example. The first high potential for erasing (−1 to −3 V, for example) is supplied to four main control gate lines MCG0 to MCG3 by the CG driver 300, whereby the first high potential for erasing is collectively supplied to the control gates 106A and 106B in all the memory cells in the sector region 0 (selected sector). At this time, the second high potential for erasing (4.5 to 5 V, for example) is supplied to all the sub bit lines SBL in the sector region 0. The method of supplying the second high potential for erasing is described later. A potential (8 V, for example) is supplied to the select signal lines BLS in the selected cells. This causes the select switching elements to be turned ON, whereby the sub bit lines and the main bit lines in the selected cells are connected. Data can be erased in all the memory cells in the selected sector region 0 in this manner.

As shown in Table 3, 0 V is supplied to all 4096 word lines WL in the non-selected sector region 1, for example. However, since 0 V can be supplied to the sub control gate lines SCG and the sub bit lines SBL separately from the sector region 0, data is not erased in the non-selected sector.

A programming operation is described below. Programming of 16-bit data is performed at the same time in MONOS memory cells respectively corresponding to 16 I/Os in the selected sector region 0. In this example, 1 V is supplied to one word line WL connected with the selected cell in the sector region 0. Other 4095 word lines WL are set to 0 V. In 16 small memory blocks 216 in the sector region 0, 2.5 V is supplied to the sub control gate line SCG corresponding to SCG [i] shown in FIG. 5. 5.5 V is supplied to the sub control gate line SCG corresponding to SCG [i+1] shown in FIG. 5. Other sub control gate lines SCG are set to 0 V. In the memory blocks 214 respectively corresponding to the I/O0 to I/O15 in the sector region 0, 5 V is supplied to one main bit line MBL corresponding to the sub bit line SBL [i+1] shown in FIG. 5. Other main bit lines MBL are set to 0 V. The sub bit line SBL in the selected memory cell is connected with the main bit line MBL by causing the select switching element to be turned ON based on the potential of the select signal line BLS.

In the non-selected cells in the selected sector region 0, the word lines WL are set to 0 V and a high potential of 5.5 V or 2.5 V, or a potential of 0 V, is applied to the sub control gate lines SCG, as shown in Table 2. The sub bit lines SBL in the non-selected cells in the selected sector region 0 are set to 0 V, since the select signal lines BLS are set to 8 V whereby the select transistors are turned ON.

In the non-selected cells in the non-selected sector region, 0 V is applied to both the sub control gate lines SCG and the main bit lines MBL, as shown in Table 3. Therefore, disturbance caused when a high potential similar to that at the time of programming is applied does not occur in the non-selected cells in the non-selected sector region.

A high potential is applied to the control gates in the non-selected cells in the selected sector region 0. However, such a high potential is applied only in the case where the programming is performed in the sector region 0. Therefore, frequency of the application of high potential is significantly decreased in comparison with the case where the high potential is applied to the non-selected cells in other sector regions each time programming is performed in one of the sector regions, whereby occurrence of disturbance can be prevented.

Description of Comparative Example

Figure 17:
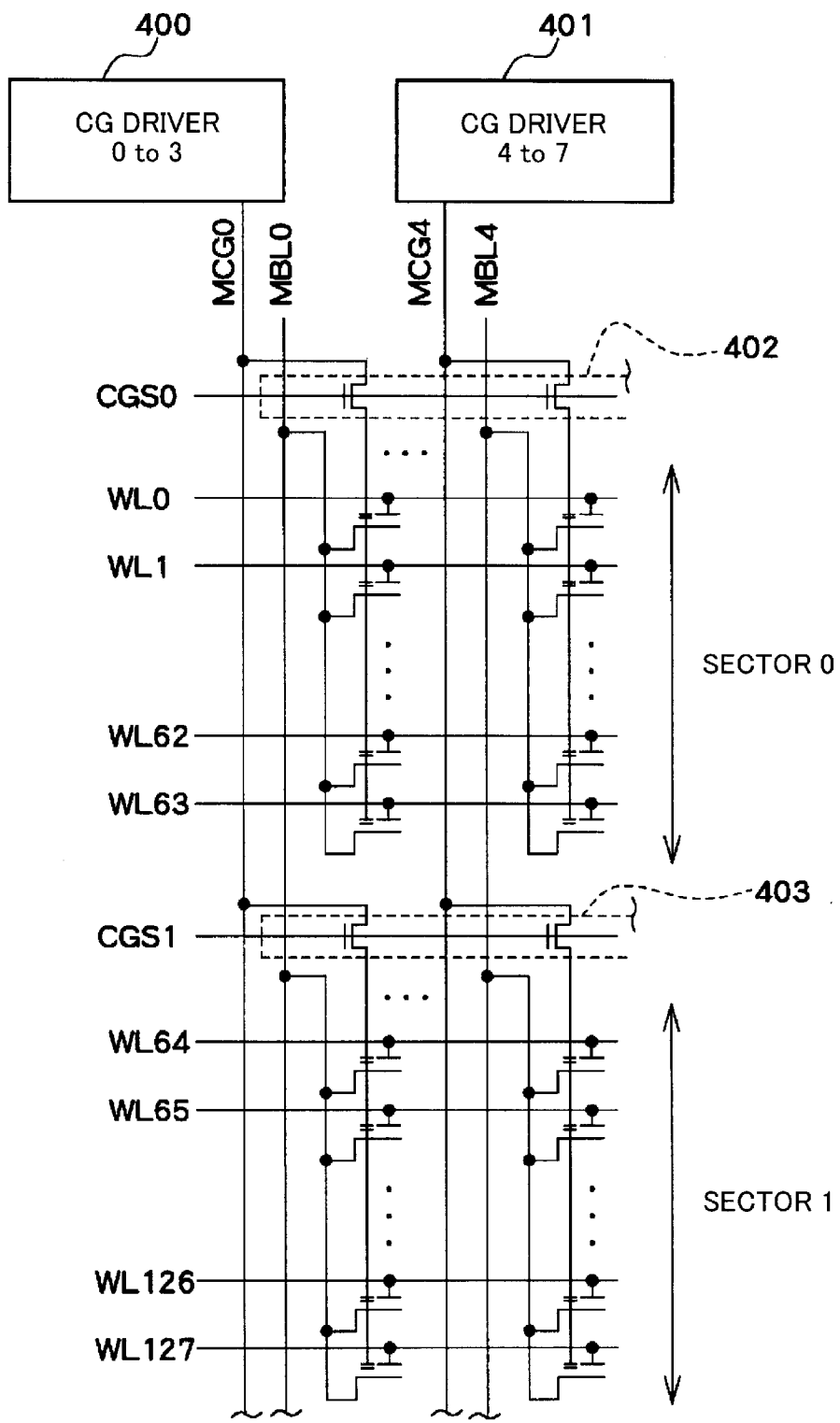
FIG. 17 is a circuit diagram showing the configuration of a comparative example for FIG. 9.

FIG. 17 shows a configuration of a comparative example. In this comparative example, the memory cell array region is divided in the column direction and has a plurality of sector regions 0, 1, . . . in which the column direction is the longitudinal direction. In the comparative example, CG drivers 400 and 401 are not formed corresponding to the sector regions 0 and 1, but are shared by the sector regions 0 and 1.

As shown in FIG. 17, a select gate region 402 and a select gate region 403 are formed corresponding to the sector region 0 and the sector region 1, respectively. N-type MOS transistors disposed in the select gate regions 402 and 403 select whether or not to supply the potential from the CG drivers 400 and 401 to the sector regions 0 and 1 based on the potential of the select signal lines CGS0 and CGS1.

In the comparative example, the potential may be set to substantially the same potential in the present embodiment shown in Tables 1 to 3. However, this can be attained by providing the select gate regions 402 and 403. If the select gate regions 402 and 403 are not provided, a high potential is also applied to the non-selected cells in the non-selected sector region 1 at the time of programming of the selected cell in the selected sector region 0. If the high potential at the time of programming is applied to the non-selected cells across the sector regions, the high potential is applied to the non-selected cells each time programming is performed, whereby disturbance occurs.

In the comparative example, it is indispensable to provide the select gate region for the control gates in each sector region in order to prevent the occurrence of disturbance.

In the comparative example, since the use of N-type MOS transistors in the select gate regions 402 and 403 causes a voltage drop to occur, a voltage for the voltage drop must be added to the necessary first high potential for erasing supplied from the CG drivers 400 and 401. This results in an increase in the voltage.

In the above-described embodiment of the present invention, the select gate region for applying a potential to the specific control gates can be omitted while preventing the occurrence of disturbance.

Modification Example

The present invention is not limited to the above-described embodiment. Various modifications and variations are possible without departing from the spirit and scope of the present invention.

1. For example, the structure of the nonvolatile memory elements 108A and 108B is not limited to the MONOS structure. The present invention may be applied to a nonvolatile semiconductor memory device using various types of other memory cells capable of independently trapping charges at two sites by one word gate 104 and first and second control gates 106A and 106B.

Figure 15:
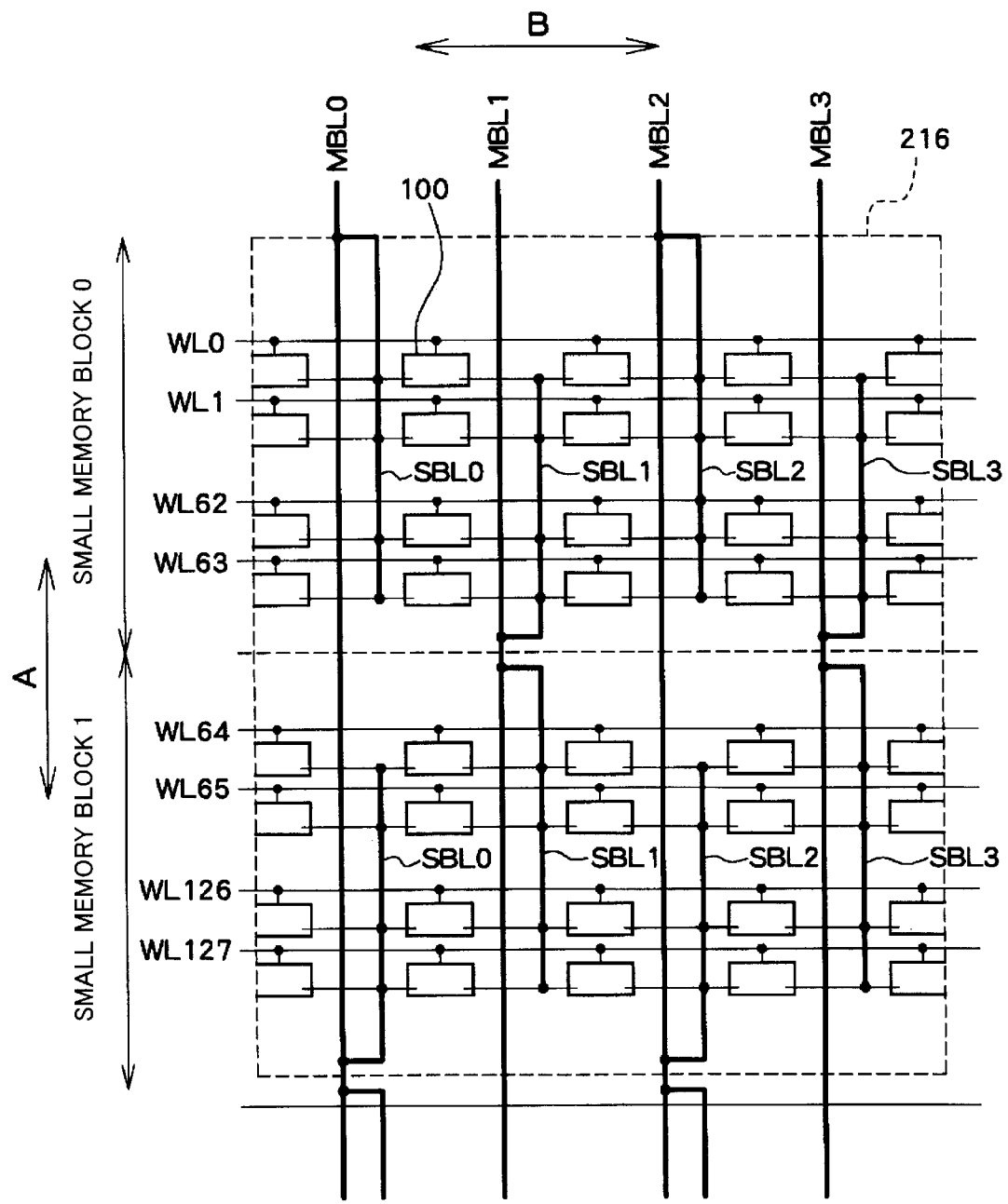
FIG. 15 is a schematic diagram for describing the memory cells in the memory cell array region according to a modification example and interconnects for the memory cells.
Figure 16:
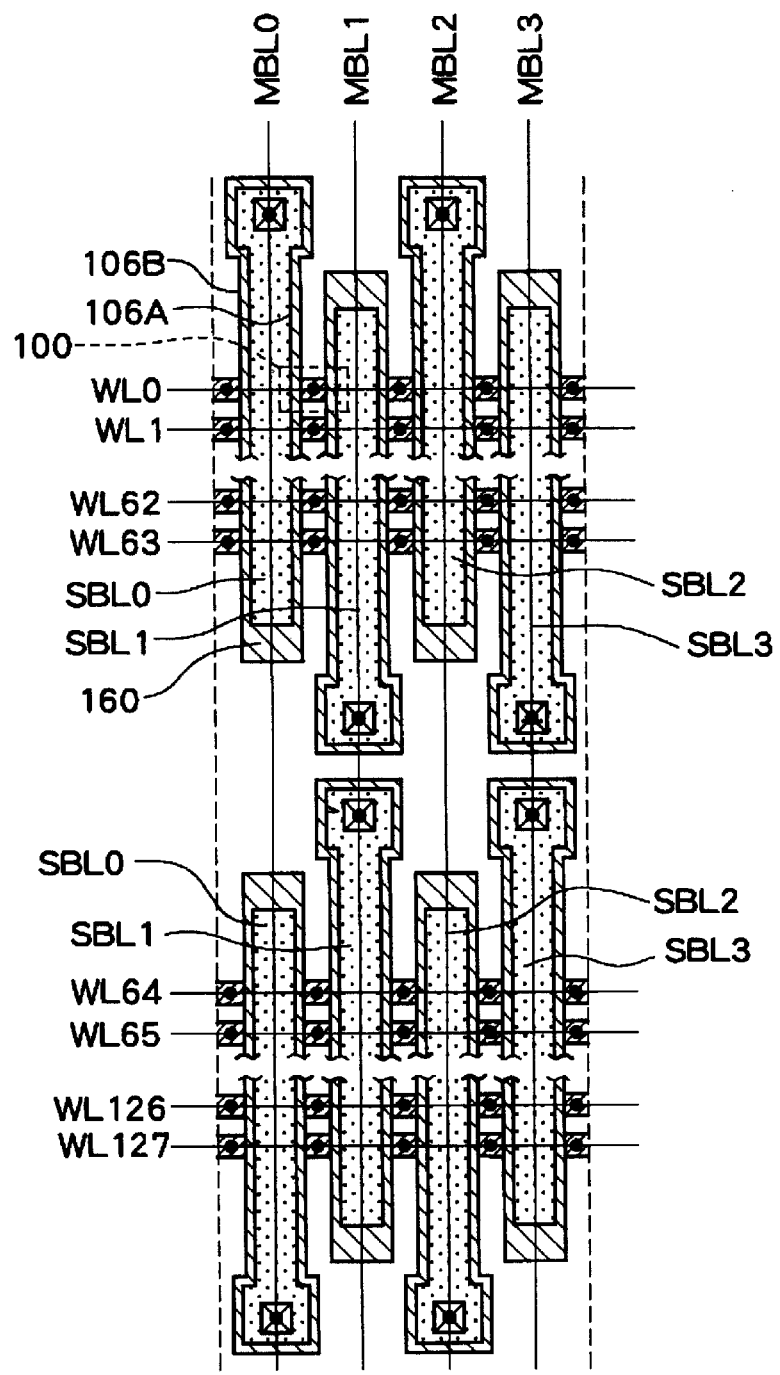
FIG. 16 is a plan view showing a planar layout of the memory cell array region shown in FIG. 15.

2. FIG. 15 is a schematic diagram for describing the memory cells in the memory cell array region according to a modification example and interconnects for the memory cells. FIG. 16 is a plan view showing a planar layout of the memory cell array region shown in FIG. 15. In FIG. 16, the word lines WL and the main bit lines MBL are schematically indicated by lines.

In the above-described embodiment, the select switching elements Q are formed at the connection points between the sub bit lines SBL and the main bit lines MBL. However, the present invention may be applied to an embodiment in which the select switching elements Q are not formed at the connection points between the sub bit lines SBL and the main bit lines MBL, as shown in FIGS. 15 and 16.

In this modification example, a high potential is applied to the sub control gate lines SCG in the non-selected cells in the selected sector region in the same manner as in the above embodiment. Therefore, if the select switching elements Q are not formed at the connection points between the sub bit lines SBL and the main bit lines MBL, a potential is applied to the sub bit lines SBL in the non-selected cells, whereby disturbance may occur. However, since the word lines WL are set to 0 V in the non-selected cells, the transistor T2 shown in FIG. 2 is not turned ON. As a result, a problem relating to disturbance can be avoided even if the select transistors are not formed.

What is claimed is:

1. A nonvolatile semiconductor memory device comprising:
   a memory cell array region in which a plurality of memory cells are arranged in a first direction and a second direction intersecting each other, each of the memory cells having first and second nonvolatile memory elements and being controlled by one word gate and first and second control gates; and
   a plurality of bit lines extending in the first direction, each of the bit lines being connected with the memory cells arranged in the first direction,
   wherein the first control gate and the second control gate adjacent each other in the second direction are respectively formed on one side and the other side of each of the plurality of bit lines,
   wherein ends of the first and second control gates formed on the one side and the other side of each of the plurality of bit lines are respectively connected by two continuous sections,
   wherein each of the plurality of bit lines has a projecting section in which one end portion thereof projects in the first direction outside an end of an adjacent bit line among the bit lines arranged in the second direction, and
   wherein the projecting section has a large-width region having a width greater than a width of each of the bit lines in a region in which the plurality of memory cells are formed.

2. The nonvolatile semiconductor memory device as defined in claim 1,
   wherein end portions of even-numbered bit lines among the plurality of bit lines, on one side, project in the first direction outside ends of odd-numbered bit lines among the plurality of bit lines, on the one side, and
   wherein end portions of the odd-numbered bit lines, on an opposite side to the one side, project in the first direction outside ends of the even-numbered bit lines, on the opposite side.

3. The nonvolatile semiconductor memory device as defined in claim 1,
   wherein the memory cell array region comprises a plurality of block regions formed by dividing the memory cell array region in the first direction, each of the block regions having the memory cells,
   wherein each of the plurality of block regions is provided with a plurality of sub bit lines extending in the first direction and connected with the memory cells, respectively,
   wherein a plurality of main bit lines are formed extending across the plurality of block regions in the first direction, each of the main bit lines being connected in common with the plurality of sub bit lines which are respectively formed in the plurality of block regions arranged in the first direction,
   wherein the first control gate and the second control gate are formed on one side and the other side of each of the plurality of sub bit lines, respectively,
   wherein ends of the first and second control gates formed on the one side and the other side of each of the plurality of sub bit lines are respectively connected by two continuous sections,
   wherein each of the plurality of sub bit lines has a projecting section in which one of the end portions projects in the first direction outside an end of an adjacent sub bit line among the sub bit lines arranged in the second direction, and
   wherein the projecting section has a large-width region having a width greater than a width of each of the sub bit lines in a region in which the plurality of memory cells are formed.

4. The nonvolatile semiconductor memory device as defined in claim 3,
   wherein end portions of even-numbered sub bit lines among the plurality of sub bit lines, on one side, project in the first direction outside ends of odd-numbered sub bit lines among the plurality of sub bit lines, on the one side, and
   wherein end portions of the odd-numbered sub bit lines, on an opposite side to the one side, project in the first direction outside ends of the even-numbered sub bit lines, on the opposite side.

5. The nonvolatile semiconductor memory device as defined in claim 3,
   wherein the plurality of sub bit lines disposed in two of the block regions adjacent in the first direction include first sub bit lines which are disposed in one of the two block regions and second sub bit lines which are disposed in the other of the two block regions, one of the first sub bit lines and one of the second sub bit lines being connected with the same one of main bit lines and respectively having projecting sections facing each other.

* * * * *